United States Patent
Fukuda et al.

(10) Patent No.: US 10,256,713 B2
(45) Date of Patent: Apr. 9, 2019

(54) POWER CONVERSION DEVICE AND METHOD FOR CONTROLLING POWER CONVERSION DEVICE

(71) Applicant: Mitsubishi Electric Corporation, Chiyoda-ku, Tokyo (JP)

(72) Inventors: Tomohito Fukuda, Tokyo (JP); Hitoshi Kawaguchi, Tokyo (JP); Kikuo Izumi, Tokyo (JP); Masanori Kageyama, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/565,309

(22) PCT Filed: May 30, 2016

(86) PCT No.: PCT/JP2016/065851
§ 371 (c)(1),
(2) Date: Oct. 9, 2017

(87) PCT Pub. No.: WO2016/194859
PCT Pub. Date: Dec. 8, 2016

(65) Prior Publication Data
US 2018/0083527 A1  Mar. 22, 2018

(30) Foreign Application Priority Data
Jun. 3, 2015 (JP) .................... 2015-112749

(51) Int. Cl.
*H02M 1/32* (2007.01)
*B60L 11/18* (2006.01)
(Continued)

(52) U.S. Cl.
CPC .......... *H02M 1/32* (2013.01); *B60L 3/0069* (2013.01); *B60L 11/18* (2013.01); *G01R 31/025* (2013.01);
(Continued)

(58) Field of Classification Search
None
See application file for complete search history.

(56) References Cited

U.S. PATENT DOCUMENTS

| | | | |
|---|---|---|---|
| 2012/0019212 A1* | 1/2012 | Krauer | H02J 7/00 320/137 |
| 2012/0038216 A1* | 2/2012 | Berry | B60L 11/005 307/77 |

(Continued)

FOREIGN PATENT DOCUMENTS

| | | |
|---|---|---|
| JP | H-07-219652 A | 8/1995 |
| JP | 2014-027826 A | 2/2014 |

(Continued)

OTHER PUBLICATIONS

International Search Report (PCT/ISA/210) dated Aug. 16, 2016, by the Japanese Patent Office as the International Searching Authority for International Application No. PCT/JP2016/065851.

(Continued)

*Primary Examiner* — Jeffrey A Gblende
(74) *Attorney, Agent, or Firm* — Buchanan Ingersoll & Rooney PC

(57) ABSTRACT

A power conversion device which converts power between a power grid and a DC power supply, includes: AC/DC converters for performing conversion from AC power to DC power or from DC power to AC power between the power grid and the DC power supply; a capacitor provided on the DC power supply side of the AC/DC converters and storing DC power; and a step-up unit for charging the capacitor.

15 Claims, 11 Drawing Sheets

(51) Int. Cl.
*H02J 7/00* (2006.01)
*G01R 31/02* (2006.01)
*G01R 31/08* (2006.01)
*H02M 7/86* (2006.01)
*B60L 3/00* (2019.01)
*H02M 1/36* (2007.01)
*H02J 3/32* (2006.01)
*H02M 7/797* (2006.01)
*H02J 7/34* (2006.01)
*H02M 3/335* (2006.01)
*H02M 1/00* (2006.01)

(52) U.S. Cl.
CPC ............... *G01R 31/08* (2013.01); *H02J 3/32* (2013.01); *H02J 7/00* (2013.01); *H02J 7/0031* (2013.01); *H02J 7/345* (2013.01); *H02M 1/36* (2013.01); *H02M 7/797* (2013.01); *H02M 7/86* (2013.01); *H02M 3/33523* (2013.01); *H02M 3/33584* (2013.01); *H02M 2001/007* (2013.01); *Y02T 10/7005* (2013.01); *Y02T 10/7022* (2013.01); *Y02T 10/7241* (2013.01); *Y02T 10/92* (2013.01); *Y02T 90/127* (2013.01)

(56) References Cited

U.S. PATENT DOCUMENTS

| | | | | |
|---|---|---|---|---|
| 2013/0038273 | A1* | 2/2013 | Riggio | H02J 7/00 320/107 |
| 2015/0131343 | A1* | 5/2015 | Hufnagel | H02M 1/42 363/49 |
| 2015/0251542 | A1* | 9/2015 | Mensah-Brown | B60L 11/005 307/10.1 |
| 2016/0065103 | A1* | 3/2016 | Glenn | H02H 9/002 318/400.21 |

FOREIGN PATENT DOCUMENTS

| | | |
|---|---|---|
| JP | 2014-135825 A | 7/2014 |
| JP | 2015-35954 A | 2/2015 |

OTHER PUBLICATIONS

Written Opinion (PCT/ISA/237) dated Aug. 16, 2016, by the Japanese Patent Office as the International Searching Authority for International Application No. PCT/JP2016/065851.

* cited by examiner

POWER CONVERSION DEVICE AND METHOD FOR CONTROLLING POWER CONVERSION DEVICE

TECHNICAL FIELD

The present invention relates to a power conversion device which converts AC power from a power grid to DC power or converts DC power from a DC power supply to AC power, between the power grid and the DC power supply, and relates to a method for controlling the power conversion device in performing interconnection with the DC power supply.

BACKGROUND ART

In recent years, as a measure against reduction in power feed capacity due to a disaster, efforts for reducing energy consumption are considered to be important, and distributed-type power supply systems represented by a photovoltaic generation system are spreading. Under such circumstances, a distributed-type power supply system having a power conversion device for converting power (e.g., storage battery power in an electric vehicle) stored during the night or the like from DC power to AC power is spreading. In this system, it is necessary to confirm soundness before interconnection with a DC power supply.

A power conversion device is disclosed in which, before a storage battery in an electric vehicle and a power conversion device are interconnected, a capacitor provided to power conversion means is charged by a step-up unit, the voltage is further stepped up using an AC/DC converter, and insulation diagnosis voltage is applied between the electric vehicle and the power conversion device, thereby confirming soundness (for example, Patent Document 1).

CITATION LIST

Patent Document

Patent Document 1: Japanese Laid-Open Patent Publication No. 2014-27826 (paragraphs [0086]-[0088] and FIG. 12)

SUMMARY OF THE INVENTION

Problems to be Solved by the Invention

However, in the invention disclosed in Patent Document 1, the voltage of the capacitor charged by the step-up unit is further stepped up by the AC/DC converter, and it is always necessary to operate the AC/DC converter. Since the AC/DC converter is less efficient when the load is low, there is a problem that the size of the step-up unit becomes large and the cost increases.

The present invention has been made to solve the above problem, and an object of the present invention is to provide a power conversion device and a method for controlling the power conversion device, that enable size reduction and cost reduction of a step-up unit used for confirming soundness before a storage battery in a DC power supply and the power conversion device are interconnected, and enable reduction in loss.

Solution to the Problems

A power conversion device according to the present invention is a power conversion device which converts power between a power grid and a DC power supply, the power conversion device including: an AC/DC converter for performing conversion from AC power to DC power or from DC power to AC power between the power grid and the DC power supply; a capacitor provided on the DC power supply side of the AC/DC converter and storing the DC power; a step-up unit for charging the capacitor; and an abnormality detection device provided on the DC power supply side of the AC/DC converter, wherein the step-up unit generates voltage for insulation diagnosis on the basis of insulation diagnosis reference voltage, and applies the voltage for insulation diagnosis to the DC power supply side of the AC/DC converter, to charge the capacitor.

A method for controlling a power conversion device according to the present invention is a method for controlling a power conversion device which includes an AC/DC converter for converting power between a power grid and a DC power supply, a capacitor provided on the DC power supply side of the AC/DC converter and storing DC power, and a step-up unit for generating voltage to charge the capacitor, the method including: an insulation diagnosis step of generating voltage for insulation diagnosis by the step-up unit and applying the voltage for insulation diagnosis between the DC power supply and the AC/DC converter, to confirm soundness; and a pre-charge step of generating voltage for pre-charging on the basis of voltage of the DC power supply by the step-up unit, to charge the capacitor, wherein the insulation diagnosis step and pre-charge step are performed before interconnection with the DC power supply is performed.

Effect of the Invention

In the power conversion device according to the present invention, the capacitor is provided on the DC power supply side of the AC/DC converter, and the step-up unit charges the capacitor. Therefore, size reduction and cost reduction of the step-up unit used for soundness confirmation can be achieved, and a loss can be reduced.

In the method for controlling a power conversion device according to the present invention, in the power conversion device including the capacitor on the DC power supply side of the AC/DC converter and the step-up unit for charging the capacitor, the insulation diagnosis step and the pre-charge step are performed. Therefore, size reduction and cost reduction of the step-up unit used for soundness confirmation can be achieved, and a loss can be reduced.

DESCRIPTION OF EMBODIMENTS

Embodiment 1

Embodiment 1 relates to a power conversion device composed of a power conversion part, a control part, and a soundness confirmation part, and includes, as major devices: an AC/DC converter for performing bidirectional power conversion between a power grid and an electric vehicle; a capacitor on a secondary side which is an electric vehicle side of the AC/DC converter; a step-up unit which generates voltage to be outputted to the secondary side of the AC/DC converter; and an abnormality detection circuit on the secondary side of the AC/DC converter.

Figure 1:
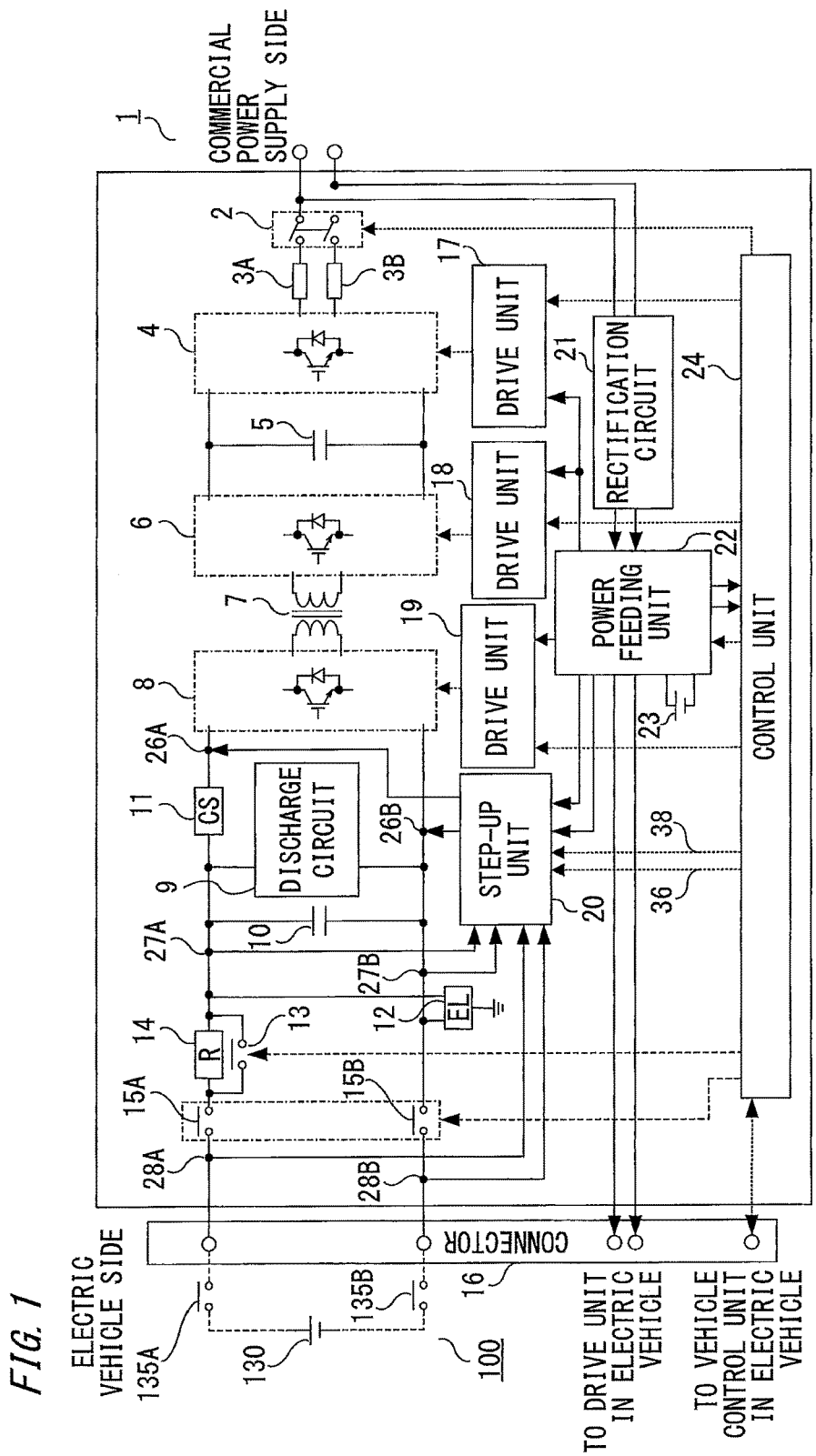
FIG. 1 is a configuration diagram of a power conversion device according to embodiment 1 of the present invention.
Figure 2:
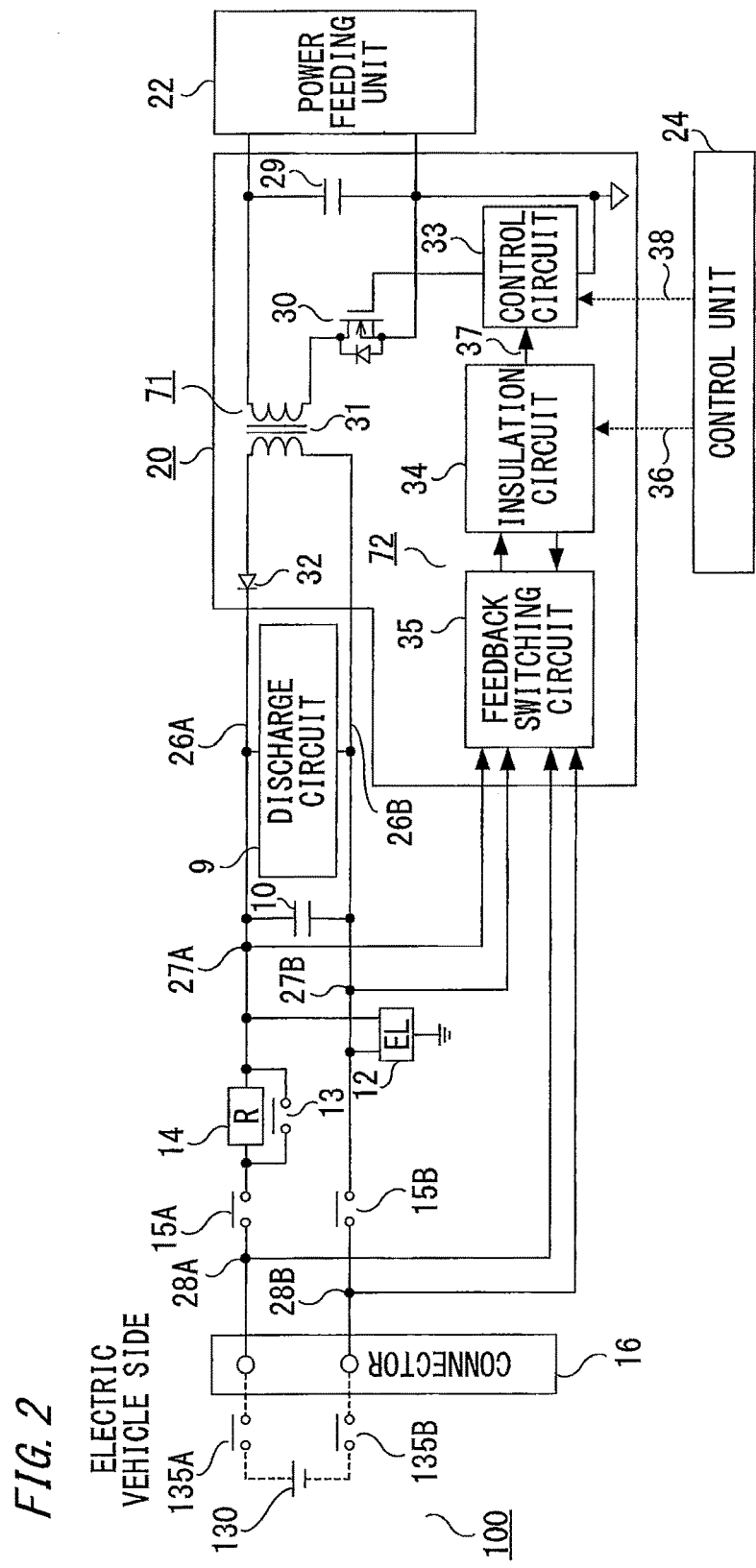
FIG. 2 is a configuration diagram of a step-up unit of the power conversion device according to embodiment 1 of the present invention.
Figure 3:
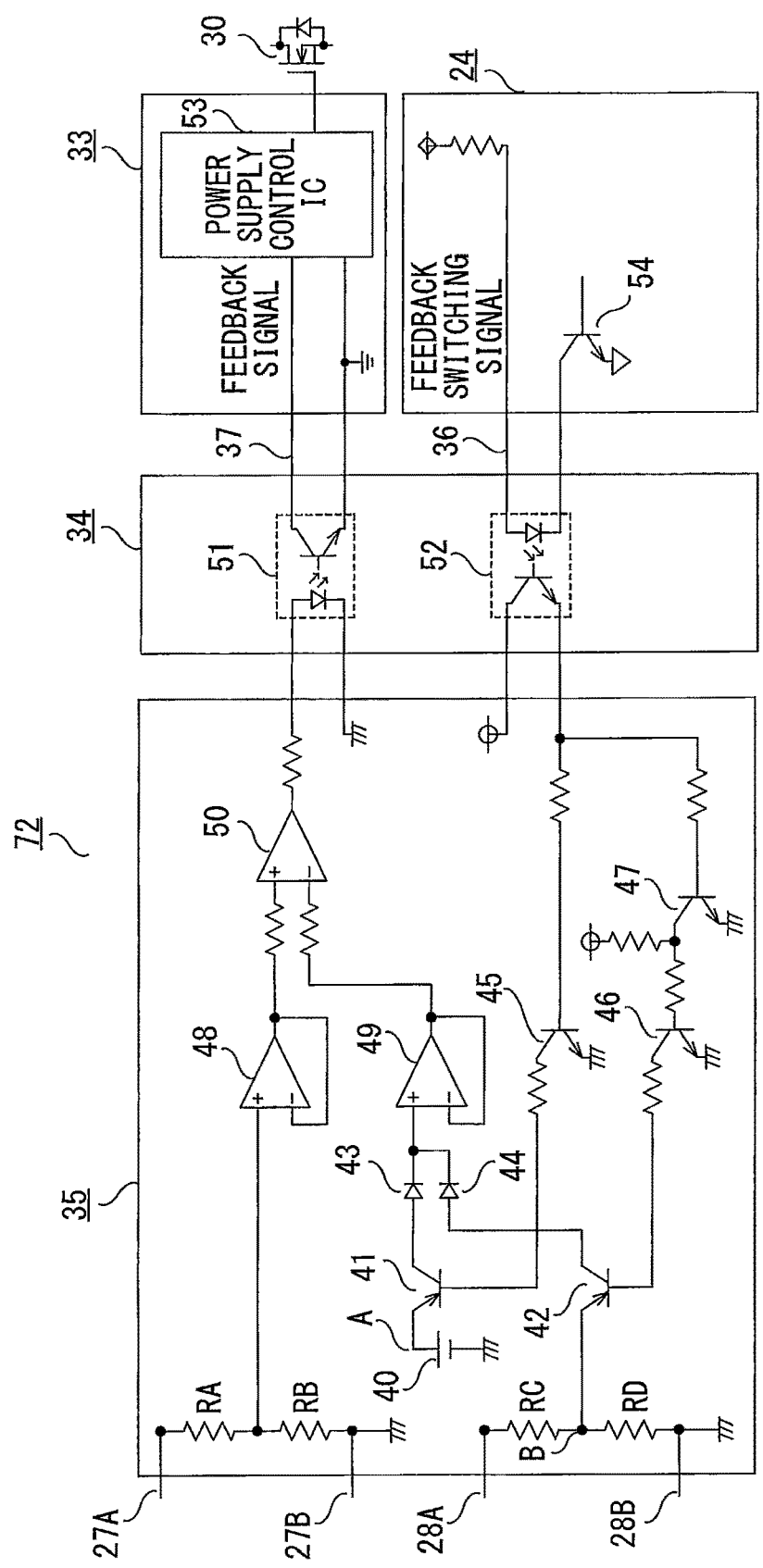
FIG. 3 is a configuration diagram of a step-up control circuit of the power conversion device according to embodiment 1 of the present invention.
Figure 4:
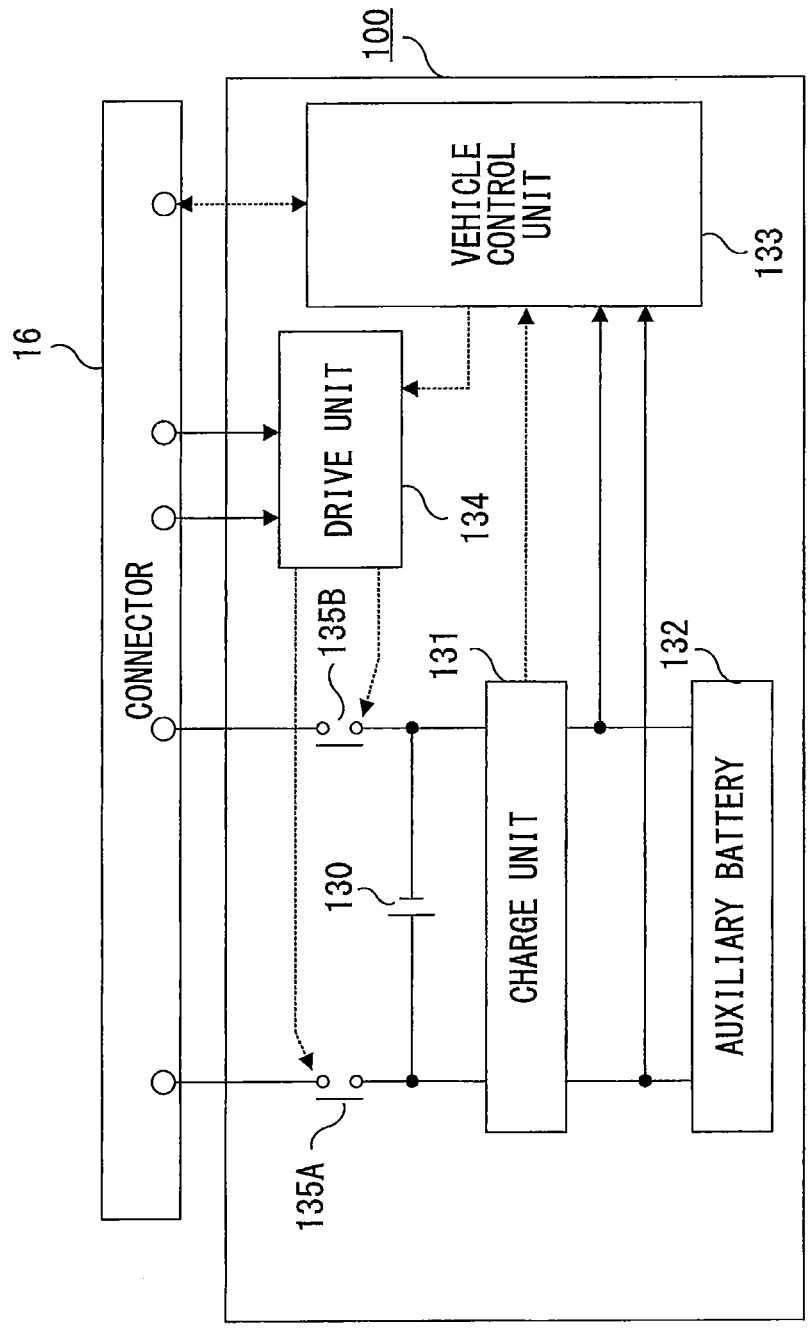
FIG. 4 is a control block diagram of an electric vehicle of the power conversion device according to embodiment 1 of the present invention.
Figure 5:
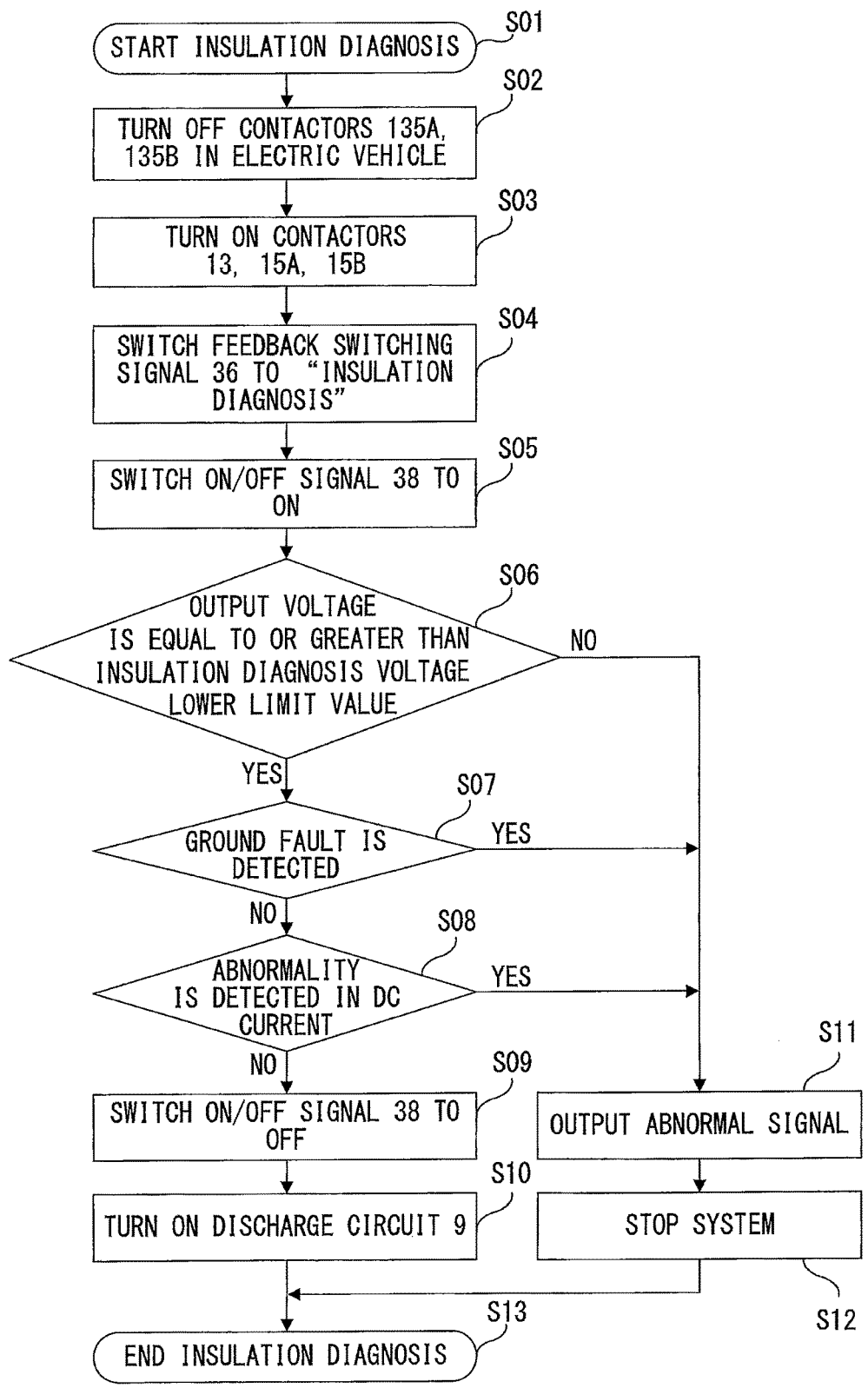
FIG. 5 is an insulation diagnosis flowchart of the power conversion device according to embodiment 1 of the present invention.
Figure 6:
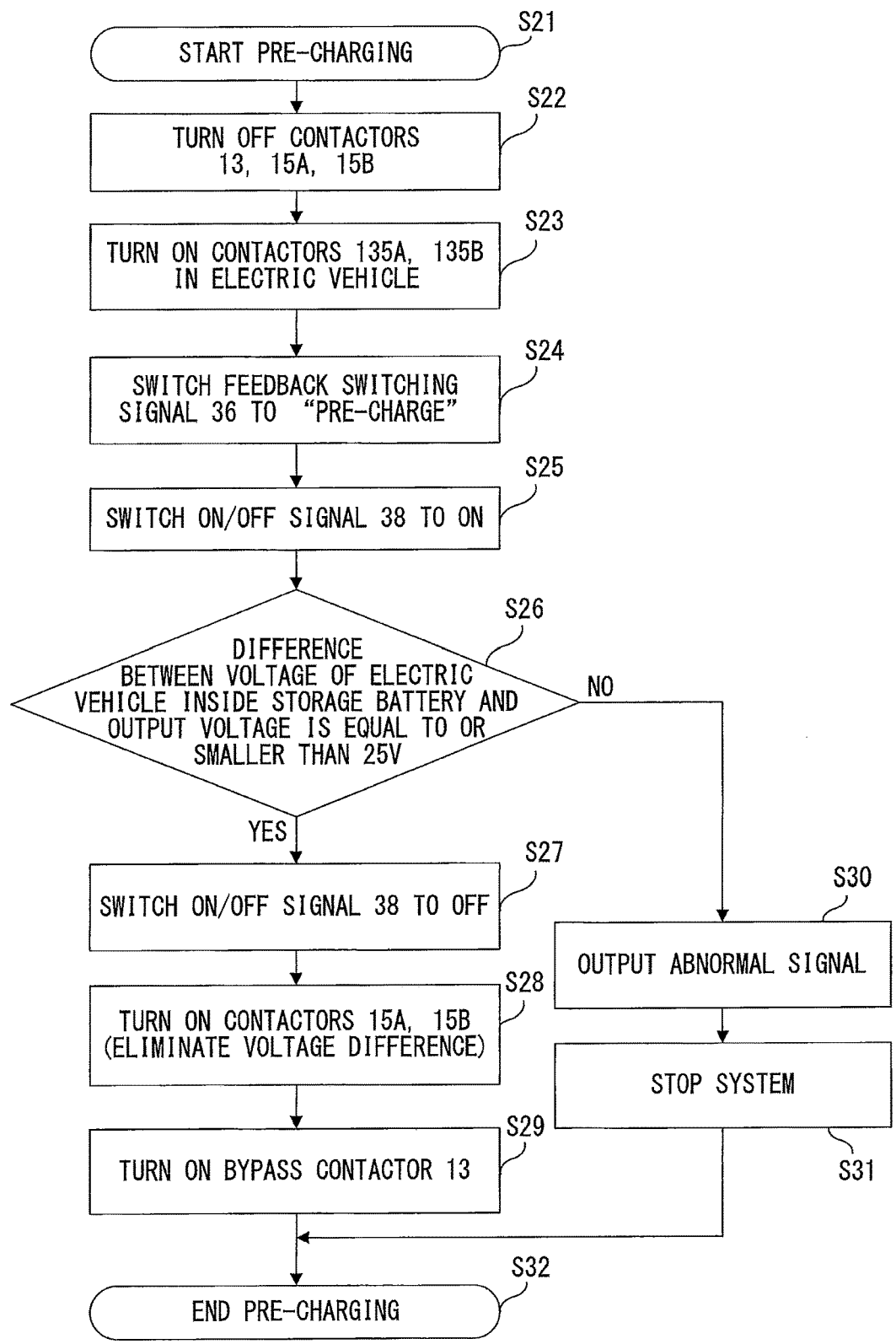
FIG. 6 is a pre-charge flowchart of the power conversion device according to embodiment 1 of the present invention.

Hereinafter, the configuration and operation of the power conversion device according to embodiment 1 will be described with reference to FIG. 1 showing a configuration diagram of the power conversion device, FIG. 2 showing a configuration diagram of the step-up unit, FIG. 3 showing a configuration diagram of a step-up control circuit, FIG. 4 showing a control block diagram of an electric vehicle, and FIG. 5 and FIG. 6 showing flowcharts of insulation diagnosis and pre-charging.

First, the configuration of the entire system including the power conversion device 1 of embodiment 1 will be described with reference to FIG. 1 and FIG. 4.

The entire system is composed of the power conversion device 1 and an electric vehicle 100 which is an interconnection target. The power conversion device 1 is roughly composed of a power conversion part, a control part, and a soundness confirmation part.

The power conversion part includes, as major devices, AC/DC converters 4, 6, 8, an isolation transformer 7, capacitors 5, 10, reactors 3A, 3B, contactors 2, 15A, 15B, and a connector 16.

The control part includes, as major devices, a control unit 24, drive units 17 to 19, a rectification circuit 21, and a power feeding unit 22.

The soundness confirmation part includes, as major devices, a step-up unit 20, a ground fault detection circuit 12, a current sensor 11, a discharge circuit 9, a contactor 13, and a limiting resistor 14.

The electric vehicle 100 includes, as major devices, an electric vehicle inside storage battery 130, a charge unit 131, an auxiliary battery 132, a vehicle control unit 133, a drive unit 134, and contactors 135A, 135B.

Next, the functions and operations of each part (power conversion part, control part, soundness confirmation part) of the power conversion device 1 and the electric vehicle 100 will be sequentially described. Thereafter, the entire operation in soundness confirmation (insulation diagnosis function and pre-charge function) will be described.

First, the function and operation of the power conversion part will be described with reference to FIG. 1.

The contactor 2 operates on the basis of a command from the control unit 24 as described later, and interconnects or parallels off the power conversion device 1 with or from a commercial power grid. When the contactor 2 is ON, the power conversion device 1 is interconnected with the commercial power grid, and when the contactor 2 is OFF, the power conversion device 1 is paralleled off from the commercial power grid.

The AC/DC converter 4 is composed of a plurality of switching elements such as a bipolar transistor, a field effect transistor, or an insulated gate bipolar transistor, and diodes connected in antiparallel with the respective switching elements. The AC/DC converter 4 is connected to the contactor 2 via the reactors 3A, 3B.

The AC/DC converter 4 converts AC power supplied from a primary side (hereinafter, refers to a commercial power grid side), to DC power. In addition, the AC/DC converter 4 converts DC power supplied from a secondary side (hereinafter, refers to an electric vehicle side), to AC power.

The AC/DC converter 6 is composed of a plurality of switching elements and diodes connected in antiparallel with the respective switching elements, as in the AC/DC converter 4. The primary side of the AC/DC converter 6 is connected to the secondary side of the AC/DC converter 4. The AC/DC converter 6 converts DC power supplied from the primary side, to AC power. In addition, the AC/DC converter 6 converts AC power supplied from the secondary side, to DC power.

Between the AC/DC converter 4 and the AC/DC converter 6, the capacitor 5 is connected for stabilizing voltage between the terminals of each AC/DC converter 4, 6.

The AC/DC converter 8 is composed of a plurality of switching elements and diodes connected in antiparallel with the respective switching elements, as in the AC/DC converters 4, 6.

The primary side of the AC/DC converter 8 is connected to the secondary side of the AC/DC converter 6 via the isolation transformer 7. The AC/DC converter 8 converts AC power supplied from the primary side, to DC power. In addition, the AC/DC converter 8 converts DC power supplied from the secondary side, to AC power. On the secondary side of the AC/DC converter 8, the capacitor 10 is connected for stabilizing voltage between terminals of the AC/DC converter 8.

The isolation transformer 7 is provided for insulating between the commercial power grid and the electric vehicle 100. By providing the isolation transformer 7, it is possible to adjust the phases of AC voltage on the secondary side of the AC/DC converter 6 and AC voltage on the primary side of the AC/DC converter 8, so as to cause voltage between both ends of the capacitor 10 to be higher or lower than voltage between both ends of the capacitor 5.

Conversely, when power is supplied from the electric vehicle inside storage battery 130, it is possible to cause voltage between both ends of the capacitor 5 to be higher or lower than voltage between both ends of the capacitor 10.

The contactors 15A, 15B operate on the basis of a command from the control unit 24, and interconnect or parallel off the power conversion device 1 and the electric vehicle 100 with or from each other.

In the power conversion device 1, AC power from the commercial power grid is converted to DC power through cooperation of the AC/DC converters 4, 6, 8, and the DC power is supplied to the electric vehicle inside storage battery 130.

Also, DC power from the electric vehicle inside storage battery 130 is converted to AC power, and the AC power is supplied to the commercial power grid.

Next, the function and operation of the control part will be described with reference to FIG. 1.

The drive units 17 to 19 respectively operate the switching elements composing the AC/DC converters 4, 6, 8, on the basis of commands from the control unit 24. Power used for control of the drive units 17 to 19 is supplied from the power feeding unit 22.

For convenience of description, operation of the AC/DC converters 4, 6, 8 when power is supplied from the primary side to the secondary side of the power conversion device 1 is referred to as a charge operation. Operation of the AC/DC converters 4, 6, 8 when power is supplied from the secondary side to the primary side of the power conversion device is referred to as a discharge operation.

The power feeding unit 22 is a unit for supplying power to the control unit 24, the step-up unit 20, and the drive units 17 to 19. The commercial power grid is connected to the power feeding unit 22 via the rectification circuit 21. Thus, DC power converted from AC power by the rectification circuit 21 is supplied to the power feeding unit 22.

The power feeding unit 22 supplies the power, supplied via the rectification circuit 21, to the control unit 24, the step-up unit 20, and the drive units 17 to 19. At the same time, the power feeding unit 22 also supplies power to a power conversion device inside storage battery 23 (hereinafter, may be referred to as storage battery 23) connected to the power feeding unit 22. Thus, the storage battery 23 in the power conversion device 1 is charged.

The power feeding unit 22 is connected to the secondary side of the AC/DC converter 8 via the step-up unit 20. In addition, the power feeding unit 22 supplies power to the step-up unit 20 before the AC/DC converter 8 is interconnected with the electric vehicle inside storage battery 130.

Since the storage battery 23 is connected to the power feeding unit 22, DC voltage is supplied from the storage battery 23 to the power feeding unit 22 when power outage occurs in the commercial power grid and operations of the AC/DC converters 4, 6, 8 temporarily stop, or when the AC/DC converters 4, 6, 8 have stopped since before power outage of the commercial power grid occurs.

In such a state, the power feeding unit 22 supplies power, supplied from the storage battery 23, to the control unit 24.

Therefore, the power conversion device 1 can operate even during power outage of the commercial power grid. When the power conversion device 1 starts discharge operation, power is supplied from the primary side of the AC/DC converter 4 to the power feeding unit 22 via the reactors 3A, 3B, the contactor 2, and the rectification circuit 21. The power feeding unit 22 can charge the storage battery 23.

The power conversion device inside storage battery 23 has a battery formed from a plurality of cells filled with an electrolytic solution.

When the commercial power grid is sound, the storage battery 23 stores power supplied from the commercial power grid to the power feeding unit 22 via the rectification circuit 21. When power outage occurs in the commercial power grid, the stored power is used for starting the AC/DC converters 4, 6, 8.

The control unit 24 includes a computer having a CPU, a memory section, and an interface section. The control unit 24 performs processes needed for ON/OFF operations of the contactors 2, 15A, 15B, control of the drive units 17 to 19, output of an ON/OFF switching signal and an ON/OFF signal to the step-up unit 20, and soundness confirmation (insulation diagnosis function, pre-charge function), and the like.

Next, the function and operation of the soundness confirmation part will be described with reference to FIG. 1 to FIG. 3.

First, focusing on the step-up unit 20, functions and operations of the contactors 13, 15A, 15B, the limiting resistor 14, the ground fault detection circuit 12, the discharge circuit 9, and the current sensor 11 will be described with reference to FIG. 2.

FIG. 2 is a configuration diagram focusing on the step-up unit 20, including the internal configuration of the step-up unit 20 and components relevant to soundness confirmation.

The step-up unit 20 steps up voltage supplied from the power feeding unit 22. The step-up unit 20 is composed of a step-up section 71 and a step-up control circuit 72.

The step-up section 71 is composed of a capacitor 29, a switching element 30, an isolation transformer 31, and a rectification diode 32. The step-up control circuit 72 is composed of a control circuit 33, an insulation circuit 34, and a feedback switching circuit 35.

The capacitor 29 stabilizes voltage supplied from the power feeding unit 22. The isolation transformer 31 insulates between the power feeding unit 22 and the secondary side of the power conversion part connected to the electric vehicle 100. On the basis of an ON/OFF signal 38 from the control unit 24 and a feedback signal 37 from the insulation circuit 34, the control circuit 33 controls switching operation of the switching element 30, thereby controlling output voltage of the step-up unit 20 to be constant. It is noted that the ON/OFF signal 38 from the control unit 24 controls a power supply control IC 53 in the control circuit 33.

The feedback switching circuit 35 switches feedback reference voltage between an insulation diagnosis case and a pre-charge case on the basis of a feedback switching signal 36 from the control unit 24 via the insulation circuit 34. The insulation circuit 34 insulates between the secondary side of the power conversion part, and the control unit 24 and the control circuit 33.

It is noted that the insulation diagnosis is performed for confirming soundness between the power conversion device 1 and the electric vehicle 100 before the power conversion device 1 and the electric vehicle 100 are interconnected.

In addition, the pre-charging is performed for suppressing inrush current flowing into the capacitor 10 when the electric vehicle 100 is interconnected with the power conversion device 1.

The step-up unit 20 switches feedback reference voltage described later between insulation diagnosis reference voltage A and pre-charge reference voltage B on the basis of the feedback switching signal 36 transmitted from the control unit 24. Thus, output voltage of the step-up unit 20 can be made equal to voltage (400V to 500V) for insulation diagnosis, or voltage of the electric vehicle inside storage battery 130 which is for pre-charging.

The step-up unit 20 outputs the controlled voltage (voltage for insulation diagnosis or pre-charging) to output ends 26A, 26B of the step-up unit 20 on the basis of the ON/OFF signal 38 transmitted from the control unit 24.

Next, the step-up control circuit 72 will be described focusing on the feedback switching circuit 35, with reference to FIG. 3, with referring to FIG. 2.

FIG. 3 shows specific circuit configurations of the feedback switching circuit 35, the insulation circuit 34, and the control circuit 33 which compose the step-up control circuit 72.

Voltage on the secondary side of the AC/DC converter 8 is inputted from first feedback ends 27A, 27B to the feedback switching circuit 35, and then the voltage divided by the division resistors RA, RB is inputted to one side (plus terminal) of an error amplifier 50. An amplifier 48 forms a voltage follower circuit, and separates the impedance on the division resistor RA, RB side and the impedance on the error amplifier 50 side from each other.

Here, the feedback reference voltage will be described.

First, reference voltage A of an insulation diagnosis reference power supply 40 is inputted to one side (minus terminal) of the error amplifier 50 through a switch 41, a diode 43, and an amplifier 49. In the case of insulation diagnosis, the switch 41 needs to be turned on, and therefore the control unit 24 transmits the feedback switching signal 36 to turn on a transistor 45 via a photo-coupler 52.

At this time, a switch 42 is turned off so that the pre-charge reference voltage B is not inputted to the error amplifier 50. In FIG. 3, a transistor 47 is turned on, a transistor 46 is turned off, and the switch 42 is turned off.

An amplifier 49 forms a voltage follower circuit, and separates the impedance on the reference voltage B side and the impedance on the error amplifier 50 side from each other, as in the amplifier 48.

Next, in the case of pre-charging, voltage of the electric vehicle inside storage battery 130 is inputted from second feedback ends 28A, 28B to the feedback switching circuit 35. The pre-charge reference voltage B divided by division resistors RC, RD is inputted to one side (minus terminal) of the error amplifier 50 via the switch 42, the diode 44, and the amplifier 49. As in the case of insulation diagnosis, the amplifier 49 forms a voltage follower circuit, and separates the impedance on the reference voltage B side and the impedance on the error amplifier 50 side from each other.

Here, in the case of pre-charging, the switch 42 needs to be turned on. Therefore, using a switch 54, the control unit 24 transmits the feedback switching signal 36, to turn off the transistor 47, turn on the transistor 46, and turn on the switch 42, via the photo-coupler 52.

At this time, the switch 41 is turned off so that the insulation diagnosis reference voltage A is not inputted to the error amplifier 50.

In FIG. 3, the transistor 45 is turned off and the switch 41 is turned off.

A switching circuit in claims corresponds to the feedback switching circuit 35.

The necessity for turning off the switch 42 so that the pre-charge reference voltage B is not inputted to one side (minus terminal) of the error amplifier 50 in the case of insulation diagnosis, will be described.

In the case of insulation diagnosis, since the contactors 15A, 15B are turned on, voltage of the first feedback ends 27A, 27B is applied also to the second feedback ends 28A, 28B. In the case where both switches 41, 42 are ON without performing switching, if the pre-charge reference voltage B is greater than the insulation diagnosis reference voltage A, voltage on the reference voltage B side is prioritized as voltage inputted to one side (minus terminal) of the error amplifier 50, and raises output voltage of the step-up unit 20.

Thereafter, the step-up unit 20 outputs voltage greater than the insulation diagnosis reference voltage A, to the output ends 26A, 26B thereof, and further, detects the outputted voltage from the second feedback ends 28A, 28B, thus further raising voltage of the output ends 26A, 26B, depending on the gains of the amplifier 49 and the error amplifier 50.

Through the above repetitive operation (loop), the maximum output voltage that can be controlled by the power supply control IC 53 is outputted, resulting in application of overvoltage exceeding the insulation diagnosis voltage (400V to 500V).

The feedback switching circuit 35 of embodiment 1 has the switches 41, 42 for switching between the insulation diagnosis reference voltage A and the pre-charge reference voltage B, and is configured to turn off the switch 42 in the case of insulation diagnosis. Therefore, in embodiment 1, without falling into the above loop, the step-up unit 20 can output the insulation diagnosis voltage (400V to 500V) with stable control.

In the case of pre-charging, since voltage of the electric vehicle inside storage battery 130 varies in a range of 135 to 450V, the pre-charge reference voltage B can be lower than the insulation diagnosis reference voltage A.

In order to normally input the pre-charge reference voltage B to one side (minus terminal) of the error amplifier 50, the switch 41 is turned off, whereby the step-up unit 20 can output voltage for pre-charging.

In the present embodiment 1, bipolar transistors are used as the switches 41, 42 for feedback switching shown in FIG. 3. However, field effect transistors can be used as the switching elements.

In the case of using bipolar transistors, voltage dropped from the reference voltage A, B by collector-emitter voltage of the bipolar transistor is inputted to the amplifier 49, whereby output voltage of the step-up unit 20 changes. In the case of using field effect transistors, since the input of the amplifier 49 has a high impedance, current flowing from the reference voltage A, B is minute current. Since the resistance between the drain and the source of the field effect transistor is small, the amount of voltage drop of the reference voltage A, B reduces.

Thus, by using field effect transistors as the feedback switching switches, it becomes possible to input reference voltages with high accuracy, thereby improving accuracy of output voltage of the step-up unit 20.

Next, the function and operation of the electric vehicle 100 will be described with reference to FIG. 4.

The electric vehicle 100 is detachably connected to the power conversion device 1 via the connector 16.

The contactors 135A, 135B are driven by the drive unit 134 on the basis of a command from the vehicle control unit 133, and interconnect or parallel off the power conversion device 1 and the electric vehicle 100 with or from each other.

The electric vehicle inside storage battery 130 is a unit for storing power used for travelling of the electric vehicle 100, and is connected to the secondary side of the contactors 135A, 135B. As the electric vehicle inside storage battery 130, normally, a plurality of lithium ion cells are used.

In the present embodiment 1, the electric vehicle inside storage battery 130 has a plurality of lithium ion cells of 3V to 4V in series, to form a battery having an inter-terminal voltage of 135V to 450V.

The electric vehicle inside storage battery 130 is connected to the power conversion device 1 via the connector 16. When the contactors 135A, 135B of the electric vehicle 100 are ON, the electric vehicle inside storage battery 130 is interconnected with the power conversion device 1, whereby power can be charged and discharged.

As for connection of the connector 16 to the electric vehicle 100, a user performs connection or detachment thereof manually. Therefore, after a user manually connects the power conversion device 1 to the electric vehicle 100, before the power conversion device 1 and the electric vehicle 100 are interconnected with each other, it is necessary to diagnose insulation between the power conversion device 1 and the electric vehicle 100.

The auxiliary battery 132 is a battery for storing power used for controlling the vehicle control unit 133. The auxiliary battery 132 has an inter-terminal voltage of about 12V or 24V, and is formed from a plurality of cells filled with an electrolytic solution.

The charge unit 131 is provided between the electric vehicle inside storage battery 130 and the auxiliary battery 132. The charge unit 131 steps down voltage of the electric vehicle inside storage battery 130 and supplies the resultant power to the auxiliary battery 132 and the vehicle control unit 133. Thus, the auxiliary battery 132 is charged and the vehicle control unit 133 is supplied with power.

The vehicle control unit 133 includes a computer having a CPU, a memory section, and an interface section. The vehicle control unit 133 is connected to the control unit 24 of the power conversion device 1 via the connector 16. The vehicle control unit 133 operates the drive unit 134 on the basis of a command from the control unit 24 of the power conversion device 1.

The vehicle control unit 133 acquires information such as the amount of power stored in the electric vehicle inside storage battery 130, and provides such information to the control unit 24 of the power conversion device 1 as necessary.

Next, operations of the insulation diagnosis function and the pre-charge function of the soundness confirmation part will be described with reference to FIG. 1 to FIG. 4, and thereafter, the insulation diagnosis method and the pre-charge method will be described with reference to flowcharts in FIG. 5 and FIG. 6.

First, operation of the insulation diagnosis function of the soundness confirmation part will be described with reference to FIG. 1 to FIG. 4.

In order to perform insulation diagnosis before interconnection with the electric vehicle 100, the contactors 15A, 15B, 13 are turned on while the contactors 135A, 135B in the electric vehicle are turned off.

In order to set voltage of the output ends 26A, 26B of the step-up unit 20 to be the insulation diagnosis voltage (400V to 500V), the switch 41 in the feedback switching circuit 35 is turned on and the switch 42 is turned off, thereby inputting the reference voltage A of the insulation diagnosis reference power supply 40 to one side (minus end) of the error amplifier 50.

Meanwhile, voltage of the first feedback ends 27A, 27B is divided by the division resistors RA, RB and the resultant voltage is inputted to another side (plus end) of the error amplifier 50.

The error amplifier 50 amplifies difference voltage between the input ends (plus end, minus end), to control the power supply control IC 53 via output current (feedback signal 37) of the photo-coupler 51. On the basis of output voltage of the error amplifier 50, the control circuit 33 controls voltage of the output ends 26A, 26B of the step-up unit 20 to be constant at the insulation diagnosis voltage (400V to 500V).

At this time, using the ground fault detection circuit 12 for detecting ground fault current and the current sensor 11 for measuring DC current, which are provided in the power conversion device 1, detection of occurrence of ground fault and measurement of DC current when the insulation diagnosis voltage (400V to 500V) is applied are performed.

As a result, if ground fault is detected between the secondary side of the AC/DC converter 8 and the contactors 135A, 135B in the electric vehicle, or if DC current equal to or greater than a reference value is measured, it can be determined that the dielectric strength between the connector 16 and the contactors 135A, 135B of the electric vehicle 100 or the dielectric strength on the power conversion device 1 side is lowered.

After the insulation diagnosis is finished, electric charge charged in the capacitor 10 is discharged by the discharge circuit 9, whereby voltage of the capacitor 10 is caused to be 0V.

Next, the pre-charge function of the soundness confirmation part will be described with reference to FIG. 1 to FIG. 4.

The contactors 15A, 15B, 13 are turned off, and the contactors 135A, 135B in the electric vehicle are turned on.

Next, in order to suppress inrush current to the electric vehicle inside storage battery 130 or the capacitor 10, operation of causing voltage of the output ends 26A, 26B of the step-up unit 20 to be equal to voltage of the electric vehicle inside storage battery 130 is performed.

First, the switch 41 in the feedback switching circuit 35 is turned off, and the switch 42 is turned on. By this operation, storage battery voltage of the electric vehicle inside storage battery 130 is inputted to the step-up unit 20 via the second feedback ends 28A, 28B. This voltage is divided by the division resistors RC, RD, and the obtained reference voltage B is inputted to one side (minus end) of the error amplifier 50.

Meanwhile, voltage of the first feedback ends 27A, 27B is divided by the division resistors RA, RB, and the resultant voltage is inputted to another end (plus end) of the error amplifier 50.

The error amplifier 50 amplifies difference voltage between the input ends (plus end, minus end), to control the power supply control IC 53 via output current (feedback signal 37) of the photo-coupler 51. On the basis of output voltage of the error amplifier 50, the control circuit 33 controls voltage of the output ends 26A, 26B of the step-up unit 20 to be equal to voltage of the electric vehicle inside storage battery 130.

In a state in which a deviation between voltage of the electric vehicle inside storage battery 130 and voltage of the output ends 26A, 26B of the step-up unit 20 has become a prescribed value (25V) or smaller, the contactors 15A, 15B are turned on. By this operation, voltage of the electric vehicle inside storage battery 130 and voltage of the output ends 26A, 26B of the step-up unit 20 become equal to each other while inrush current is suppressed.

Next, by turning on the contactor 13 for bypass, connection between the electric vehicle inside storage battery 130 and the power conversion device 1 is made into a normal operation state.

Next, the insulation diagnosis method before interconnection will be described on the basis of the flowchart in FIG. 5, referring to FIG. 1 to FIG. 4 as necessary.

A method for diagnosing insulation between the secondary side of the AC/DC converter 8 of the power conversion device 1 and the primary side of the contactors 135A, 135B in the electric vehicle, will be described.

When the insulation diagnosis is started (S01), first, the contactors 135A, 135B of the electric vehicle 100 are turned off (S02).

Next, the contactors 13, 15A, 15B of the power conversion device 1 are turned on (S03). By this operation, connection is established between the secondary side of the AC/DC converter 8 of the power conversion device 1 and the primary side of the contactors 135A, 135B of the electric vehicle 100.

Next, the feedback switching signal 36 from the control unit 24 is switched to "insulation diagnosis" (S04). By this operation, the feedback switching signal 36 is turned on, the switch 41 in the feedback switching circuit 35 is turned on, and the switch 42 is turned off, whereby the reference voltage A of the insulation diagnosis reference power supply 40 is inputted to one side (minus end) of the error amplifier 50.

Next, the ON/OFF signal 38 inputted from the control unit 24 to the control circuit 33 is turned on (S05). By this operation, the step-up control circuit 72 controls output voltage of the output ends 26A, 26B of the step-up unit 20 to be voltage (here, about 400V to 500V) based on the insulation diagnosis reference voltage A. The step-up unit 20 applies the insulation diagnosis voltage on the area between the secondary side of the AC/DC converter 8 of the power conversion device 1 and the primary side of the contactors 135A, 135B of the electric vehicle 100.

Next, whether voltage of the first feedback ends 27A, 27B is normal (here, equal to or greater than an insulation diagnosis voltage lower limit value) is confirmed (S06).

At this time, if there is insulation abnormality in the insulation diagnosis target part from the secondary side of the AC/DC converter 8 of the power conversion device 1 to the primary side of the contactors 135A, 135B in the electric vehicle, normal voltage (400V to 500V) is not applied to the first feedback ends 27A, 27B monitored by the control unit 24. If voltage of the first feedback ends 27A, 27B is smaller than the insulation diagnosis voltage lower limit value, the voltage is determined to be abnormal, and an abnormal signal is outputted from the control unit 24 (S11).

If the voltage is determined to be normal in step S06, whether or not ground fault occurs is detected by the ground fault detection circuit 12 provided between the ground and the first feedback ends 27A, 27B (S07). If ground fault occurs between the ground and the first feedback ends 27A, 27B, the control unit 24 outputs an abnormal signal in response to an abnormal signal from the ground fault detection circuit 12 (S11).

If no ground fault occurs in step S07, DC current is measured by the current sensor 11 provided on the first feedback end 27A side, to detect whether or not there is abnormality (S08). If DC current equal to or greater than a reference value is measured by the current sensor 11, the control unit 24 outputs an abnormal signal (S11).

If abnormality is detected in any of the insulation diagnosis voltage, ground fault detection, and DC current abnormality detection (S11), the control unit 24 stops the system (power conversion device 1) safely (S12) and the insulation diagnosis process is ended (S13). Necessary countermeasures are performed in accordance with the abnormality occurrence condition.

If the result in step S08 is normal, i.e., the insulation diagnosis voltage, ground fault detection, and DC current abnormality detection are all normal, the ON/OFF signal 38 outputted from the control unit 24 to the control circuit 33 is turned off (S09).

Next, the control unit 24 operates the discharge circuit 9 to discharge electric charge charged in the capacitor 10 (S10). Thus, the insulation diagnosis process is ended (S13).

Next, the pre-charge method will be described on the basis of the flowchart in FIG. 6, referring to FIG. 1 to FIG. 4 as necessary.

A method for pre-charging the capacitor 10 will be described which is performed for suppressing inrush current flowing into the capacitor 10 or the electric vehicle inside storage battery 130 when the electric vehicle 100, i.e., the electric vehicle inside storage battery 130, is interconnected with the power conversion device 1.

When the pre-charge operation is started (S21), the contactors 13, 15A, 15B of the power conversion device 1 are turned off (S22).

Next, the contactors 135A, 135B of the electric vehicle 100 are turned on (S23).

Next, the feedback switching signal 36 from the control unit 24 is switched to "pre-charge" (S24). By this operation, the switch 41 in the feedback switching circuit 35 is turned off and the switch 42 is turned on, whereby storage battery voltage of the electric vehicle inside storage battery 130 is inputted to the step-up unit 20 via the second feedback ends 28A, 28B. This voltage is divided by the division resistors RC, RD, and the obtained reference voltage B is inputted to one side (minus end) of the error amplifier 50.

Next, the ON/OFF signal 38 inputted from the control unit 24 to the control circuit 33 is turned on (S25). By this operation, the step-up control circuit 72 controls output voltage of the output ends 26A, 26B of the step-up unit 20 to be voltage of the storage battery 130 in the electric vehicle 100, to pre-charge the capacitor 10.

The voltage of the electric vehicle inside storage battery 130 varies in a range of about 135V to 450V, depending on the amount of electric charge stored therein. Whether a deviation between the storage battery voltage and output voltage of the step-up unit 20, i.e., charge voltage of the capacitor 10 is equal to or smaller than a prescribed value (here, the deviation is equal to or smaller than 25V) is confirmed (S26).

If the deviation exceeds the prescribed value, an abnormal signal is outputted from the control unit 24 (S30), the system (power conversion device 1) is stopped safely (S31), and the pre-charge process is ended (S32). Necessary countermeasures are performed in accordance with the abnormality occurrence condition.

If the deviation between voltage of the electric vehicle inside storage battery 130 and voltage charged in the capacitor 10 is equal to or smaller than the prescribed value in step S26, the pre-charge is determined to be normal and the ON/OFF signal 38 outputted from the control unit 24 to the control circuit 33 is turned off (S27).

Next, the contactors 15A, 15B are turned on (S28). By this operation, while inrush current flowing due to a voltage difference between voltage of the electric vehicle inside storage battery 130 and voltage of the pre-charged capacitor 10 is limited by the limiting resistor 14, the voltage difference is eliminated.

Next, the contactor 13 is turned on (S29). By this operation, the limiting resistor 14 is bypassed and connection between the power conversion device 1 and the electric vehicle inside storage battery 130 is completed. Thus, the pre-charge process is ended (S32).

After interconnection between the power conversion device 1 and the electric vehicle inside storage battery 130 is completed, the control unit 24 drives the drive units 17 to 19 to perform charge operation or discharge operation.

In the power conversion device 1 of embodiment 1, the step-up unit 20 is connected to the capacitor 10 (capacitance: about 60 uF to 300 uF) which has a smaller capacitance than the capacitor 5 (capacitance: about 2000 uF to 20000 uF).

In a conventional power conversion device, a capacitor corresponding to the capacitor 5 is charged with a certain voltage and the AC/DC converter is operated to charge a capacitor corresponding to the capacitor 10. However, in this case, since the load is low, the efficiency is low and there is a great loss. In embodiment 1, since it is not necessary to operate the AC/DC converter, loss reduction and energy saving in the power conversion device 1 can be achieved, and size reduction and cost reduction of the step-up unit 20 can be achieved.

The charging periods in the insulation diagnosis and the pre-charging depend on the capacitance of a capacitor to be charged. In the power conversion device 1 of embodiment 1, since the capacitor 10 having a small capacitance as compared to the capacitor 5 is charged, it is possible to charge in a short time even by the step-up unit 20 having a small capacity, and thus the user's operation time can be shortened.

In embodiment 1, it is possible to diagnose insulation between the primary side of the contactors 135A, 135B in the electric vehicle 100 and the secondary side of the AC/DC converter 8 of the power conversion device 1, before the electric vehicle 100 and the power conversion device 1 are interconnected. Thus, soundness is confirmed before the power conversion device 1 and the electric vehicle 100 are interconnected, and occurrence of ground fault and short-circuit of the electric vehicle inside storage battery 130 at the time of interconnection can be prevented. Thus, the function of the power conversion device 1 can be enhanced, and occurrence of failure in the electric vehicle and the power conversion device 1 can be prevented.

In embodiment 1, in insulation diagnosis, soundness is confirmed using the insulation diagnosis voltage, the ground fault detection circuit 12, and the current sensor 11. However, it is also possible to confirm soundness by detecting only the ground fault current. As the abnormality detection device, both the ground fault detection circuit and the current sensor are provided. However, it is also possible to confirm soundness in insulation diagnosis by providing only one of them.

In embodiment 1, the capacitor 10 is charged in advance to have voltage equal to voltage of the electric vehicle inside storage battery 130. Thus, when the electric vehicle 100 is interconnected with the power conversion device 1, inrush current flowing into the capacitor 10 or the electric vehicle inside storage battery 130 is suppressed. Thus, contact welding of the contactors 15A, 15B of the power conversion device 1 and the contactors 135A, 135B in the electric vehicle can be prevented, and the contactors can be downsized. Further, since burnout of the limiting resistor 14 of the power conversion device 1 can be prevented, the limiting resistor can be downsized. Thus, size reduction and quality improvement of the power conversion device 1 can be achieved.

In addition, since sharp charge/discharge current does not flow through the electric vehicle inside storage battery 130, the life of the electric vehicle inside storage battery 130 can be prolonged.

In the invention of the present application, switching between the insulation diagnosis function and the pre-charge function is performed by the feedback switching signal 36 from the control unit 24 to the step-up unit 20. Specifically, this function switching is performed by the switches 41, 42 being switched by the feedback switching signal 36 so as to switch between the reference voltage A for insulation diagnosis and the reference voltage B for pre-charging. Thus, since the insulation diagnosis function and the pre-charge function are achieved by one step-up unit 20, decrease in the number of the step-up units 20 and the size reduction thereof can be achieved. Therefore, the environment protection of the product can be improved and the environmental load can be reduced.

In addition, by using field effect transistors instead of bipolar transistors as the switching elements of the step-up control circuit 72 of the step-up unit 20, the amount of voltage drop in the switches can be reduced. Therefore, it is possible to improve accuracy of output voltage of the step-up unit 20.

In the description in embodiment 1, the case where a target to be interconnected with the power conversion device 1 is the electric vehicle 100 having the electric vehicle inside storage battery 130, has been shown.

However, instead of the electric vehicle, a power storage unit including a DC power supply, e.g., a dedicated battery, may be used. In addition, the power storage unit may be a photovoltaic generation device having a battery or a wind power generation device having a battery.

In embodiment 1, as shown in FIG. 1, the case where the power conversion device 1 has single-phase AC/DC converters 4, 6, 8 has been described. However, this is merely an example, and the power conversion device 1 may have three-phase AC/DC converters.

In the case of having three-phase AC/DC converters, as the isolation transformer, an isolation transformer of Y-Y connection type, an isolation transformer of Y-Δ connection type, or an isolation transformer of Δ-Δ connection type may be used. In such a case, it becomes easy to adapt to a domestic power grid of single-phase three-wire type.

In embodiment 1, the power conversion device inside storage battery 23 is composed of a plurality of cells filled with an electrolytic solution. However, the storage battery 23 may be a lead storage battery, lithium ion battery cells, or the like.

The storage battery 23 only has to store power used for control. Therefore, for example, an alkaline dry cell or the like may be used. Instead of always providing the storage battery 23, the storage battery 23 may be connected to the control unit 24 only in the case of power outage, by providing a connection terminal.

When charged power in the storage battery 23 is insufficient, a general-purpose dry cell may be connected to supply power to the control unit 24.

Instead of the storage battery 23, a portable generator, a fuel battery, a solar battery, or a wind power generator may be used. As the portable generator, the one that generates power using propane gas, gasoline, or light oil may be used, or the one configured from a Peltier element which generates power using thermal energy stored in a water heater may be used.

As described above, even if an alkaline dry cell, a portable generator, a fuel battery, or the like is used as the power conversion device inside storage battery 23 instead of a lead storage battery, the same effect can be obtained.

The inter-terminal voltage of the storage battery is not limited to about 135V to 450V.

As described above, the power conversion device of embodiment 1 is composed of the power conversion part, the control part, and the soundness confirmation part, and includes, as major devices: the AC/DC converter for converting power between the power grid and the electric vehicle; the capacitor on the secondary side of the AC/DC converter; the step-up unit for generating voltage to be outputted to the secondary side of the AC/DC converter; and the abnormality detection circuit on the secondary side of the AC/DC converter. Therefore, it is possible to obtain a power conversion device that enables size reduction and cost reduction of the step-up unit and enables loss reduction.

Embodiment 2

In a power conversion device of embodiment 2, an analog switch is used as the switch for switching in the step-up control circuit of the step-up unit.

Figure 7:
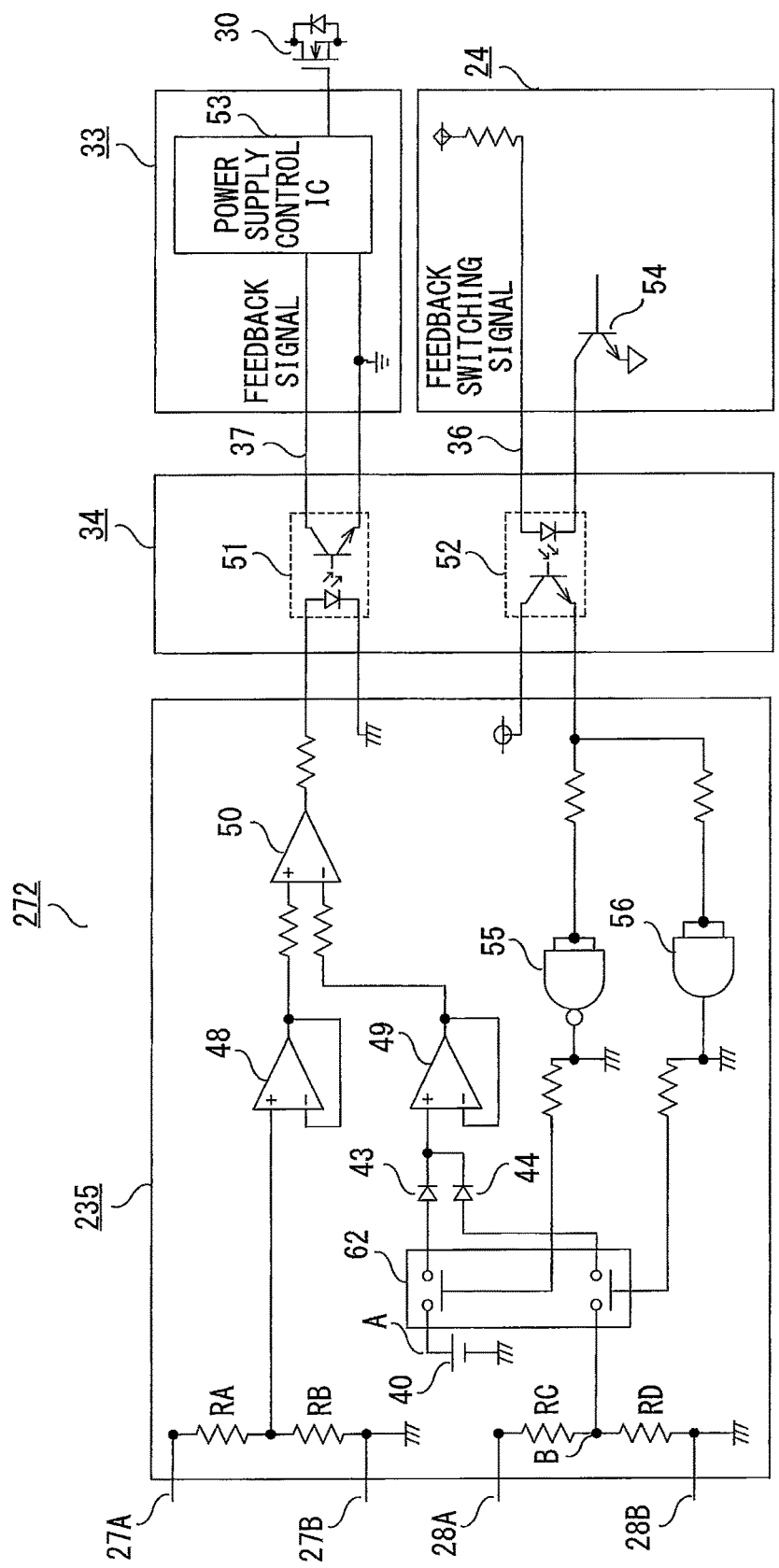
FIG. 7 is a configuration diagram of a step-up control circuit of a power conversion device according to embodiment 2 of the present invention.

Hereinafter, the power conversion device of embodiment 2 will be described focusing on a difference from embodiment 1, with reference to FIG. 7 showing a configuration diagram of a step-up control circuit. In FIG. 7, components that are the same as or correspond to those in FIG. 3 in embodiment 1 are denoted by the same reference characters.

For discrimination from the power conversion device 1 of embodiment 1, the step-up control circuit and the feedback switching circuit in embodiment 2 are denoted by 272 and 235, respectively.

First, the configuration of the step-up control circuit 272 of the power conversion device of the embodiment 2 will be described with reference to FIG. 7.

A difference from the step-up control circuit 72 of embodiment 1 is components of the feedback switching circuit 35. Specifically, in the feedback switching circuit 235, the switches 41, 42 of the feedback switching circuit 35 are changed to an analog switch 62. The transistor 45 is changed to a logic IC 55, and the transistors 46, 47 are changed to a logic IC 56.

In embodiment 1, voltage dropped from the reference voltage A, B by the collector-emitter voltage of the bipolar transistor is inputted to the amplifier 49, whereby output voltage of the step-up unit 20 changes.

The analog switch 62 used in the feedback switching circuit 235 of embodiment 2 has a low resistance. Since input of the amplifier 49 has a high impedance, current flowing from the reference voltage A, B is minute current. Therefore, in the feedback switching circuit 235 of embodiment 2, the amount of voltage drop of the reference voltage A, B decreases. Thus, it becomes possible to input reference voltage with high accuracy to the error amplifier 50, and output voltage of the step-up unit does not change.

As described above, in the power conversion device of embodiment 2, the analog switch is used as the switch for switching in the step-up control circuit of the step-up unit. Therefore, as in embodiment 1, size reduction and cost reduction of the step-up unit can be achieved, and the loss can be reduced. Further, accuracy of output voltage of the step-up unit can be improved.

Embodiment 3

In a power conversion device of embodiment 3, an electromagnetic-contact-type relay is used as the switch for switching in the step-up control circuit of the step-up unit.

Figure 8:
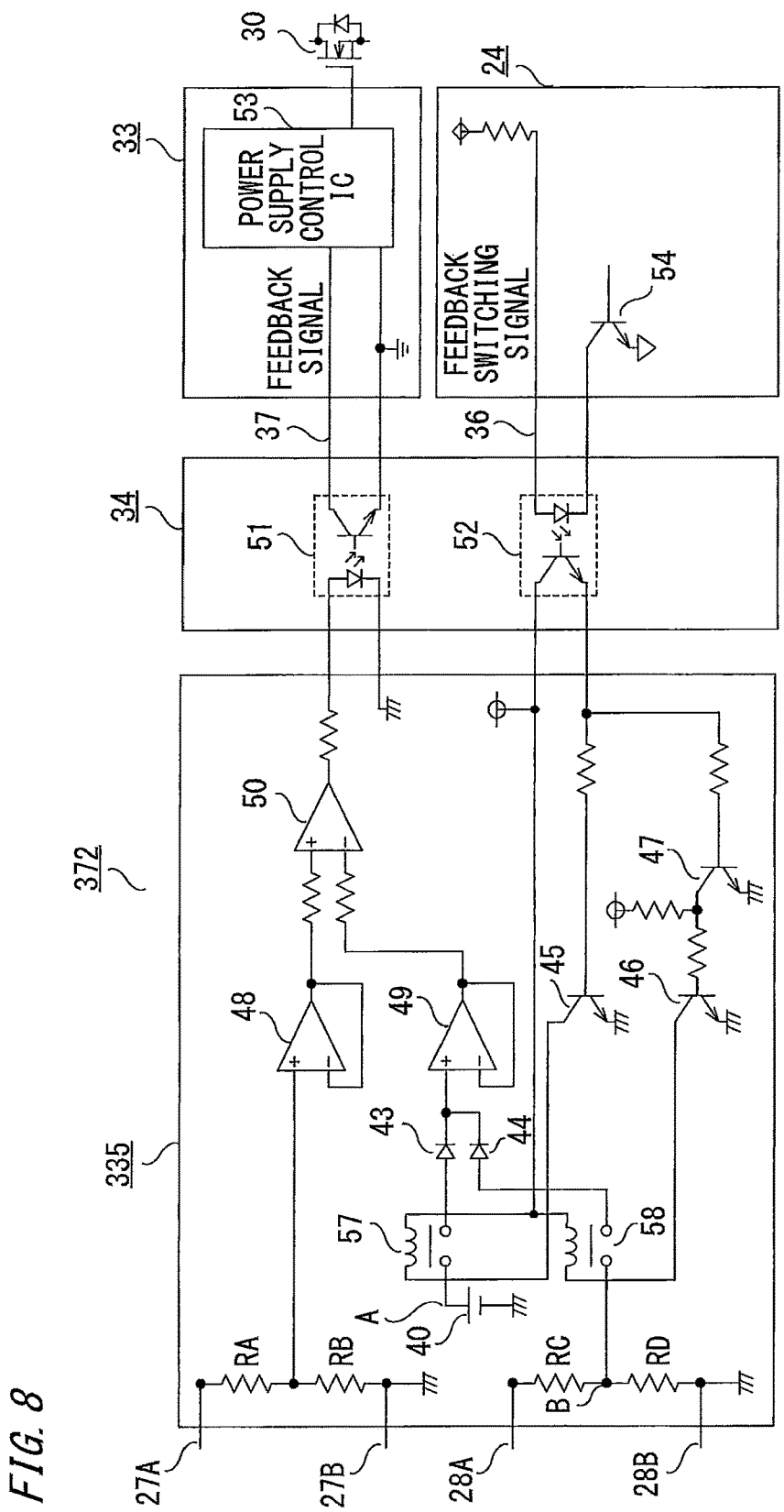
FIG. 8 is a configuration diagram of a step-up control circuit of a power conversion device according to embodiment 3 of the present invention.

Hereinafter, the power conversion device of embodiment 3 will be described focusing on a difference from embodiment 1, with reference to FIG. 8 showing a configuration diagram of a step-up control circuit. In FIG. 8, components that are the same as or correspond to those in FIG. 3 in embodiment 1 are denoted by the same reference characters.

For discrimination from the power conversion device 1 of embodiment 1, the step-up control circuit and the feedback switching circuit in embodiment 3 are denoted by 372 and 335, respectively.

First, the configuration of the step-up control circuit 372 of the power conversion device of the embodiment 3 will be described with reference to FIG. 8.

A difference from the step-up control circuit 72 of embodiment 1 is components of the feedback switching circuit 35. Specifically, in the feedback switching circuit 335, the switches 41, 42 of the feedback switching circuit 35 are changed to electromagnetic-contact-type relays 57, 58.

In embodiment 1, voltage dropped from the reference voltage A, B by the collector-emitter voltage of the bipolar transistor is inputted to the amplifier 49, whereby output voltage of the step-up unit 20 changes.

The contacts of the electromagnetic-contact-type relays 57, 58 used in the feedback switching circuit 335 of embodiment 3 have low resistances. Since input of the amplifier 49 has a high impedance, current flowing from the reference voltage A, B is minute current. Therefore, in the feedback switching circuit 335 of embodiment 3, the amount of voltage drop of the reference voltage A, B decreases. Thus, it becomes possible to input reference voltage with high accuracy to the error amplifier 50, and output voltage of the step-up unit does not change.

As described above, in the power conversion device of embodiment 3, the electromagnetic-contact-type relays are used as the switch for switching in the step-up control circuit of the step-up unit. Therefore, as in embodiment 1, size reduction and cost reduction of the step-up unit can be achieved, and the loss can be reduced. Further, accuracy of output voltage of the step-up unit can be improved.

Embodiment 4

In a power conversion device of embodiment 4, the feedback switching signal in the step-up control circuit of the step-up unit is separated into a signal for insulation diagnosis and a signal for pre-charging.

Figure 9:
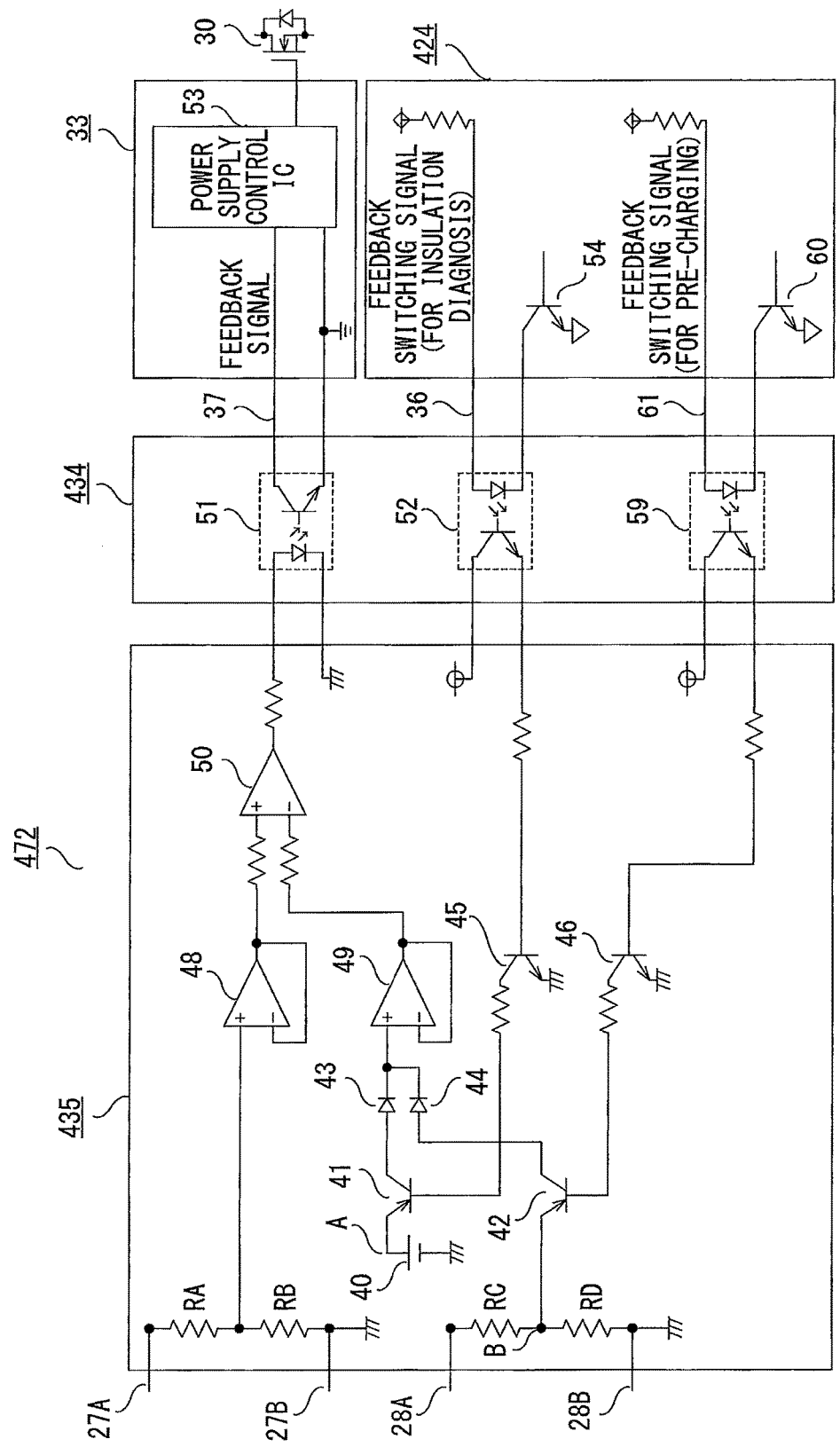
FIG. 9 is a configuration diagram of a step-up control circuit of a power conversion device according to embodiment 4 of the present invention.

Hereinafter, the power conversion device of embodiment 4 will be described focusing on a difference from embodiment 1, with reference to FIG. 9 showing a configuration diagram of a step-up control circuit. In FIG. 9, components that are the same as or correspond to those in FIG. 3 in embodiment 1 are denoted by the same reference characters.

For discrimination from the power conversion device 1 of embodiment 1, the control unit, the step-up control circuit, the feedback switching circuit, and the insulation circuit in embodiment 4 are denoted by 424, 472, 435, and 434, respectively.

First, the configuration of the step-up control circuit 472 of the power conversion device of embodiment 4 will be mainly described with reference to FIG. 9.

A difference from the step-up control circuit 72 of embodiment 1 is mainly the configurations of the feedback switching circuit 435 and the insulation circuit 434. Specifically, in the feedback switching circuit 435, the transistor 47 of the feedback switching circuit 35 is removed, and a feedback switching signal for pre-charging for turning on or off the switch 42 is separately provided. That is, ON/OFF switching of the switch 42 is performed by a transistor 60 of the control unit 424 and a photo-coupler 59 of the insulation circuit 434.

In embodiment 4, since the feedback switching signal 61 for pre-charging is separately provided, the transistor 60 of the control unit 424 and the photo-coupler 59 of the insulation circuit 434 are added. However, one of the transistors of the feedback switching circuit 435 can be removed, and thus size reduction of the step-up unit is promoted.

As described above, in the power conversion device of embodiment 4, the feedback switching signal in the step-up control circuit of the step-up unit is separated into a signal for insulation diagnosis and a signal for pre-charging. Therefore, as in embodiment 1, size reduction and cost reduction of the step-up unit can be achieved, and the loss can be reduced. Further, size reduction of the step-up unit is promoted.

Embodiment 5

In a power conversion device of embodiment 5, inputs and a switching circuit of the insulation diagnosis reference voltage and the pre-charge reference voltage in the step-up unit are simplified.

Figure 10:
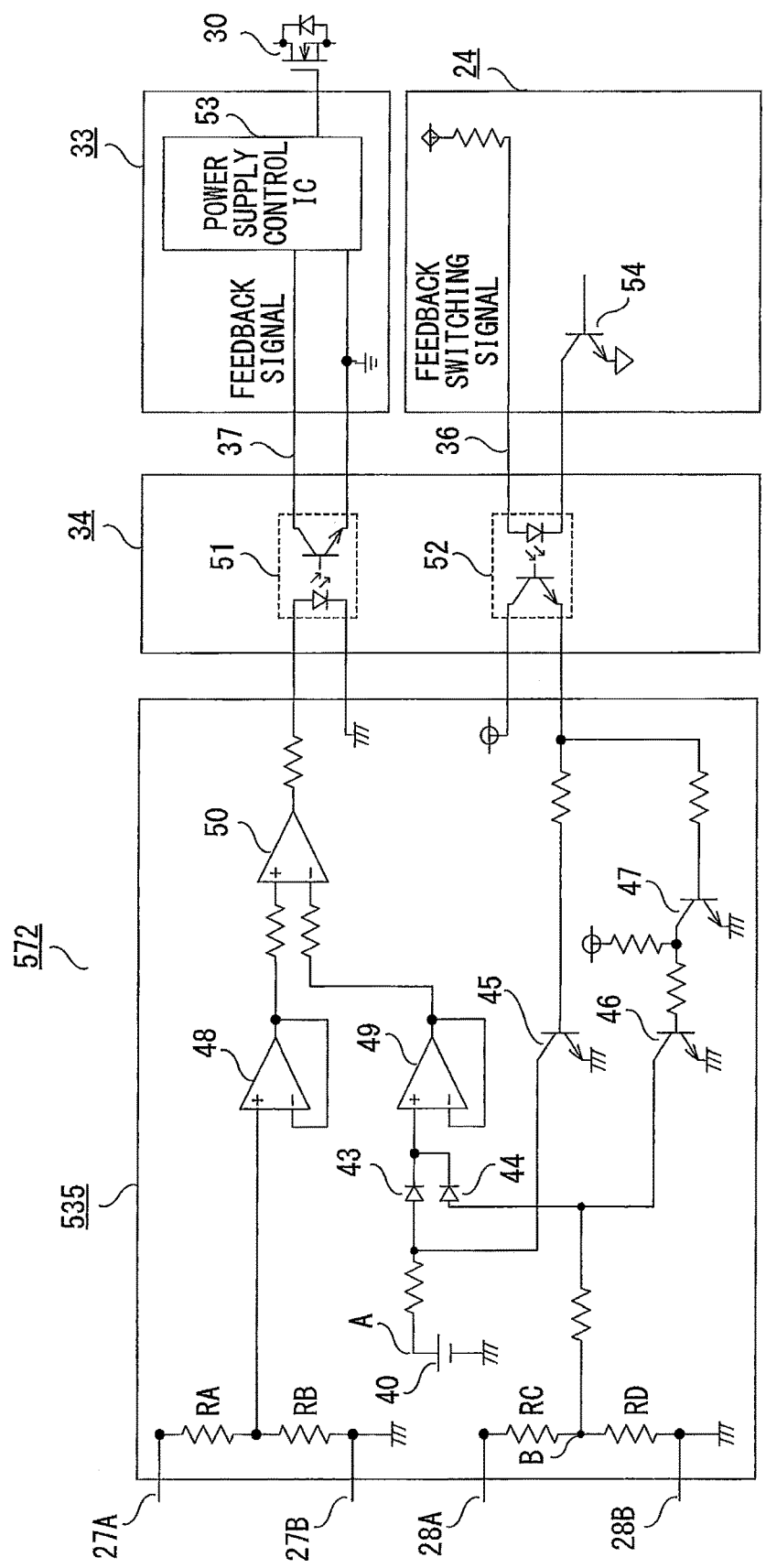
FIG. 10 is a configuration diagram of a step-up control circuit of a power conversion device according to embodiment 5 of the present invention.

Hereinafter, the power conversion device of embodiment 5 will be described focusing on a difference from embodiment 1, with reference to FIG. 10 showing a configuration diagram of a step-up control circuit. In FIG. 10, components that are the same as or correspond to those in FIG. 3 in embodiment 1 are denoted by the same reference characters.

For discrimination from the power conversion device 1 of embodiment 1, the step-up control circuit and the feedback switching circuit in embodiment 5 are denoted by 572 and 535, respectively.

First, the configuration of the step-up control circuit 572 of the power conversion device of embodiment 5 of the present invention will be mainly described with reference to FIG. 10.

A difference from the step-up control circuit 72 of embodiment 1 is the configuration of the feedback switching circuit 35. Specifically, in the feedback switching circuit 535, the switches 41, 42 of the feedback switching circuit 35 are removed, so that inputs and a switching circuit of the insulation diagnosis reference voltage and the pre-charge reference voltage to the amplifier 49 are simplified.

In embodiment 5, since inputs and a switching circuit of the insulation diagnosis reference voltage and the pre-charge reference voltage are simplified, size reduction of the step-up unit is promoted.

As described above, in the power conversion device of embodiment 5, inputs and a switching circuit of the insulation diagnosis reference voltage and the pre-charge reference voltage in the step-up unit are simplified. Therefore, as in embodiment 1, size reduction and cost reduction of the step-up unit can be achieved, and the loss can be reduced. Further, size reduction of the step-up unit is promoted.

Embodiment 6

In a power conversion device of embodiment 6, the insulation diagnosis reference voltage and the pre-charge reference voltage in the step-up unit are set to be equal to or smaller than the emitter-collector withstand voltage of the bipolar transistors.

Figure 11:
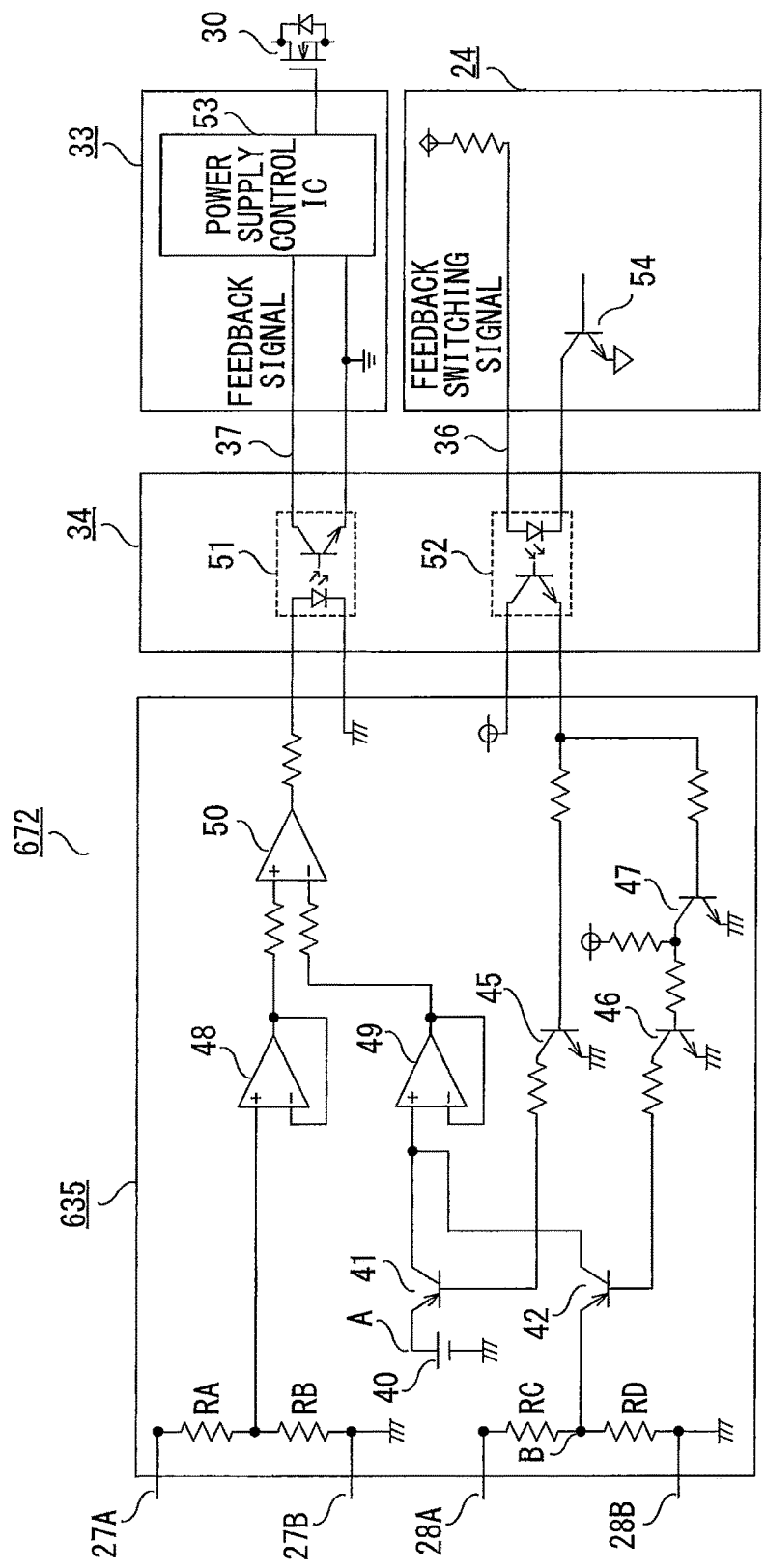
FIG. 11 is a configuration diagram of a step-up control circuit of a power conversion device according to embodiment 6 of the present invention.

Hereinafter, the power conversion device of embodiment 6 will be described focusing on a difference from embodiment 1, with reference to FIG. 11 showing a configuration diagram of a step-up control circuit. In FIG. 11, components that are the same as or correspond to those in FIG. 3 in embodiment 1 are denoted by the same reference characters.

For discrimination from the power conversion device 1 of embodiment 1, the step-up control circuit and the feedback switching circuit in embodiment 6 are denoted by 672 and 635, respectively.

First, the configuration of the step-up control circuit 672 of the power conversion device of embodiment 6 of the present invention will be mainly described with reference to FIG. 11.

A difference from the step-up control circuit 72 of embodiment 1 is the configuration of the feedback switching circuit 35. Specifically, in the feedback switching circuit 635, the diodes 43, 44 of the feedback switching circuit 35 are removed, and the collector sides of the switches 41, 42 are directly connected to the plus terminal of the amplifier 49 for the insulation diagnosis reference voltage and the pre-charge reference voltage.

In embodiment 6, since the diodes 43, 44 for protecting the transistors are removed, it is necessary to set the insulation diagnosis reference voltage and the pre-charge reference voltage in the step-up unit to be equal to or smaller than the emitter-collector withstand voltage of the bipolar transistors.

However, by removing the diodes 43, 44, size reduction of the step-up unit is promoted. In addition, the amount of voltage drop due to forward-direction voltage of the diode can be reduced, and further, change in the voltage drop amount of the forward-direction voltage of the diode due to component variation or temperature characteristics can be eliminated. Therefore, the reference voltage A, B is accurately inputted to the amplifier 49, and accuracy of output voltage of the step-up unit can be improved.

In the above case, a difference from embodiment 1 has been described with reference to FIG. 3 in embodiment 1. However, also in the step-up control circuits of embodiments 2 to 5, accuracy of output voltage of the step-up unit can be improved by removing the diodes 43, 44 in the feedback switching circuit.

As described above, in the power conversion device of embodiment 6, the insulation diagnosis reference voltage and the pre-charge reference voltage in the step-up unit are set to be equal to or smaller than the emitter-collector withstand voltage of the bipolar transistors. Therefore, as in embodiment 1, size reduction and cost reduction of the step-up unit can be achieved, and the loss can be reduced. Further, size reduction of the step-up unit is promoted, and accuracy of output voltage of the step-up unit can be improved.

It is noted that, within the scope of the present invention, the above embodiments may be freely combined with each other, or each of the above embodiments may be modified or simplified as appropriate.

INDUSTRIAL APPLICABILITY

The present invention relates to a power conversion device which converts AC power from a power grid to DC power or converts DC power from a DC power supply to AC power, between the power grid and the DC power supply, and relates to a method for controlling the power conversion device in performing interconnection with the DC power supply. The present invention is widely applicable to power conversion devices provided between a power grid and a DC power supply, and control methods therefor.

The invention claimed is:

1. A power conversion device which converts power between a power grid and a DC power supply, the power conversion device comprising:
    an AC/DC converter for performing conversion from AC power to DC power or from DC power to AC power between the power grid and the DC power supply;
    a capacitor provided on a DC power supply side of the AC/DC converter and storing the DC power;
    a step-up unit for charging the capacitor; and
    an abnormality detection device provided on the DC power supply side of the AC/DC converter, wherein
    the step-up unit generates voltage for insulation diagnosis based on an insulation diagnosis reference voltage, wherein a source of the insulation diagnosis reference voltage is different from the DC power supply, and applies the voltage for insulation diagnosis to the DC power supply side of the AC/DC converter, to charge the capacitor.

2. The power conversion device according to claim 1, wherein the step-up unit generates voltage for pre-charging based on voltage of the DC power supply, to charge the capacitor.

3. The power conversion device according to claim 2, wherein
the step-up unit includes a switching circuit for switching between a signal of the insulation diagnosis reference voltage and a signal of the voltage of the DC power supply.

4. The power conversion device according to claim 3, wherein
a field effect transistor is used for the switching circuit.

5. The power conversion device according to claim 3, wherein
an analog switch is used for the switching circuit.

6. The power conversion device according to claim 3, wherein
an electromagnetic-contact-type relay is used for the switching circuit.

7. The power conversion device according to claim 1, wherein
the DC power supply is a storage battery inside an electric vehicle.

8. The power conversion device according to claim 1, wherein
the abnormality detection device is composed of both or one of a ground fault detection circuit and a current sensor.

9. The power conversion device according to claim 1, wherein
the step-up unit generates the voltage for insulation diagnosis based on the insulation diagnosis reference voltage, using a switch and an amplifier.

10. The power conversion device according to claim 9, wherein
the step-up unit further includes a diode between the switch and the amplifier.

11. A method for controlling a power conversion device which includes an AC/DC converter for converting power between a power grid and a DC power supply, a capacitor provided on a DC power supply side of the AC/DC converter and storing DC power, and a step-up unit for generating voltage to charge the capacitor, the method comprising:
an insulation diagnosis step of generating voltage for insulation diagnosis, by the step-up unit, and based on an insulation diagnosis reference voltage, wherein a source of the insulation diagnosis reference voltage is different from the DC power supply, and applying the voltage for insulation diagnosis between the DC power supply and the AC/DC converter; and
a pre-charge step of generating voltage for pre-charging based on voltage of the DC power supply, by the step-up unit, to charge the capacitor, wherein
the insulation diagnosis step and the pre-charge step are performed before interconnection of the power conversion device with the DC power supply is performed.

12. The power conversion device according to claim 2, wherein
the DC power supply is a storage battery inside an electric vehicle.

13. The power conversion device according to claim 2, wherein
the abnormality detection device is composed of both or one of a ground fault detection circuit and a current sensor.

14. The power conversion device according to claim 3, wherein
the DC power supply is a storage battery inside an electric vehicle.

15. The power conversion device according to claim 3, wherein
the abnormality detection device is composed of both or one of a ground fault detection circuit and a current sensor.

* * * * *